(12) United States Patent
Lee

(10) Patent No.: US 12,273,113 B2
(45) Date of Patent: Apr. 8, 2025

(54) DELAY CONTROL CIRCUIT AND A MEMORY MODULE INCLUDING THE SAME

(71) Applicant: SAMSUNG ELECTRONICS CO., LTD., Suwon-si (KR)

(72) Inventor: Bumsoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 18/101,653

(22) Filed: Jan. 26, 2023

(65) Prior Publication Data

US 2023/0387900 A1   Nov. 30, 2023

(30) Foreign Application Priority Data

May 27, 2022   (KR) .................. 10-2022-0065184

(51) Int. Cl.
*G11C 11/4096* (2006.01)
*H03K 3/03* (2006.01)
*H03K 5/13* (2014.01)
*H03K 19/08* (2006.01)
*H03K 5/00* (2006.01)

(52) U.S. Cl.
CPC ............ *H03K 5/13* (2013.01); *G11C 11/4096* (2013.01); *H03K 3/0315* (2013.01); *H03K 19/08* (2013.01); *H03K 2005/00078* (2013.01)

(58) Field of Classification Search
CPC .... G11C 11/4096; H03K 5/13; H03K 3/0315; H03K 19/08; H03K 2005/00078
See application file for complete search history.

(56) References Cited

U.S. PATENT DOCUMENTS

| | | | |
|---|---|---|---|
| 6,735,709 B1 | 5/2004 | Lee et al. | |
| 7,477,083 B2 | 1/2009 | Fujisawa et al. | |
| 7,664,216 B2 | 2/2010 | Schnarr | |
| 8,411,517 B2 | 4/2013 | Choi | |
| 9,178,498 B2 | 11/2015 | Chong | |
| 2001/0007136 A1 | 7/2001 | Tamura et al. | |
| 2004/0105292 A1* | 6/2004 | Matsui | G11C 7/1093 365/189.05 |

(Continued)

FOREIGN PATENT DOCUMENTS

KR   10-2010-0027777   3/2010

*Primary Examiner* — Sung Il Cho
(74) *Attorney, Agent, or Firm* — F. CHAU & ASSOCIATES, LLC

(57) ABSTRACT

A delay control circuit includes: a delay cell including a plurality of bias inverters, first RC circuits, and second RC circuits, the delay cell activates a number of first RC circuits in response to a step code, delays a signal by a delay time based on the number of the activated first RC circuits, and outputs the delayed signal; a ZQ calibrator including pull-up and pull-down circuits, the ZQ calibrator adjusts a number of activated pull-up and pull-down circuits, and inputs a pull-up and pull-down voltage, based on a calibration code to the bias inverters; and a step adjuster including a first ring oscillator including test delay cells, the step adjuster determining characteristics of the first and second RC circuits and activates a number of second RC circuits based on the characteristics and an operating frequency of the delay control circuit.

20 Claims, 12 Drawing Sheets

(56) References Cited

U.S. PATENT DOCUMENTS

| | | | |
|---|---|---|---|
| 2014/0192583 A1* | 7/2014 | Rajan | G11C 7/10 |
| | | | 365/63 |
| 2014/0279759 A1* | 9/2014 | Yang | G11C 29/022 |
| | | | 706/12 |
| 2014/0368249 A1 | 12/2014 | Lee | |
| 2020/0118612 A1* | 4/2020 | Finn | G11C 7/1093 |
| 2021/0065757 A1* | 3/2021 | Li | G11C 7/1066 |

* cited by examiner

340

|  | SLOW | TYP | FAST |
|---|---|---|---|
| 3200Mbps | 12 | 8 | 5 |
| 3600Mbps | 13 | 9 | 6 |
| 4000Mbps | 14 | 10 | 7 |
| 4400Mbps | 15 | 11 | 8 |
| 4800Mbps | 16 | 12 | 9 |
| 5200Mbps | 17 | 13 | 10 |
| 5600Mbps | 18 | 14 | 11 |
| 6000Mbps | 19 | 15 | 12 |
| 6400Mbps | 20 | 16 | 13 |

FIG. 7

DELAY CONTROL CIRCUIT AND A MEMORY MODULE INCLUDING THE SAME

CROSS-REFERENCE TO RELATED APPLICATION(S)

This application claims priority under 35 U.S.C. § 119 to Korean Patent Application No. 10-2022-0065184 filed on May 27, 2022 in the Korean Intellectual Property Office, the disclosure of which is incorporated by reference herein in its entirety.

TECHNICAL FIELD

The present inventive concept relates to a delay control circuit and a memory module including the same.

DISCUSSION OF RELATED ART

A dynamic random access memory (DRAM) is a type of RAM that stores each bit of data in a memory cell. A DRAM, commonly employed as a main memory of an electronic system, tends to have a high speed and a high degree of integration. Such a DRAM may include a plurality of input/output pins. A plurality of command/address pins may be included among the plurality of input/output pins.

In order for a command and data to be accurately transmitted to the DRAM through the plurality of command/address pins, a signal is input to the plurality of command/address pins within a predetermined data bit time. As DRAMs become faster, data bit times decrease. As a result, signals are input to the plurality of command/address pins almost simultaneously.

In order to train the DRAM such that signals are input to the plurality of command/address pins almost simultaneously, a delay cell for delaying a command/address signal in a constant step may be employed.

SUMMARY

An embodiment of the present inventive concept provides a delay control circuit to compensate for process-voltage-temperature (PVT) characteristics of a delay cell such that the delay cell delays an input signal in a constant step.

An embodiment of the present inventive concept provides a delay control circuit to control a delay cell based on an operating frequency of a semiconductor device such that the delay cell delays an input signal in a constant step irrespective of the operating frequency.

An embodiment of the present inventive concept provides a memory module including a memory controller to delay a signal in a constant step irrespective of an operating frequency of a memory device, and to train the memory device using the signal delayed by the constant step.

According to an embodiment of the present inventive concept, there is provided a delay control circuit including: a delay cell including a plurality of bias inverters, a plurality of first RC circuits, and a plurality of second RC circuits, wherein the delay cell activates a number of first RC circuits in response to a value of a step code, delays a signal that was externally input, by a delay time based on the number of the activated first RC circuits, and outputs the delayed signal; a ZQ calibrator including a plurality of pull-up circuits and a plurality of pull-down circuits, wherein the ZQ calibrator adjusts a number of activated pull-up circuits and a number of activated pull-down circuits, to adjust an impedance of a transmission line, and inputs a pull-up voltage and a pull-down voltage, based on a calibration code corresponding to the number of the activated pull-up circuits and the number of the activated pull-down circuits, to the plurality of bias inverters; and a step adjuster including a first ring oscillator including a plurality of test delay cells having a circuit structure, equal to a circuit structure of the delay cell, wherein the step adjuster determines characteristics of the first and second RC circuits, based on a pulse period that depends on whether or not the second RC circuits included in the first ring oscillator are activated, and activates a number of second RC circuits based on the characteristics and an operating frequency of the delay control circuit.

According to an embodiment of the present inventive concept, there is provided a delay control circuit including: a delay cell including a plurality of bias inverters, a plurality of first RC circuits, and a plurality of second RC circuits, wherein the delay cell activates a number of first RC circuits based on a value of an externally input step code, delays an externally input signal by a delay time based on the number of the activated first RC circuits, and outputs the delayed signal; a ZQ calibrator for adjusting a value of a ZQ calibration code to adjust an impedance of a transmission line, and for inputting a pull-up voltage and a pull-down voltage, based on the ZQ calibration code, to the plurality of bias inverters; and a step adjuster for determining characteristics of the second RC circuits based on a delay time depending on whether or not the second RC circuits are activated, and determining a number of second RC circuits to be activated, according to the characteristics and an operating frequency of the delay control circuit, to control a delay time of the delay cell to increase in a constant step independent of the operating frequency.

According to an embodiment of the present inventive concept, there is provided a memory module including: a memory device including a plurality of command/address pins; and a memory controller for inputting signals to the command/address pins, wherein the memory controller comprises a delay cell for delaying an input signal by a delay time based on a value of a step code, uses a look-up table and a ZQ calibration code to adjust the delay cell such that the delay time is increased by a constant step according to the value of the step code, and uses the adjusted delay cell to adjust a timing at which each signal is output therefrom such that the signals are simultaneously input to the command/address pins.

BRIEF DESCRIPTION OF THE DRAWINGS

The above and other features of the present inventive concept will be more clearly understood from the following detailed description, taken in conjunction with the accompanying drawings, in which:

FIG. 7 is a view illustrating a look-up table according to an embodiment of the present inventive concept.

DETAILED DESCRIPTION OF THE EMBODIMENTS

Hereinafter, embodiments of the present inventive concept will be described with reference to the accompanying drawings.

Figure 1:
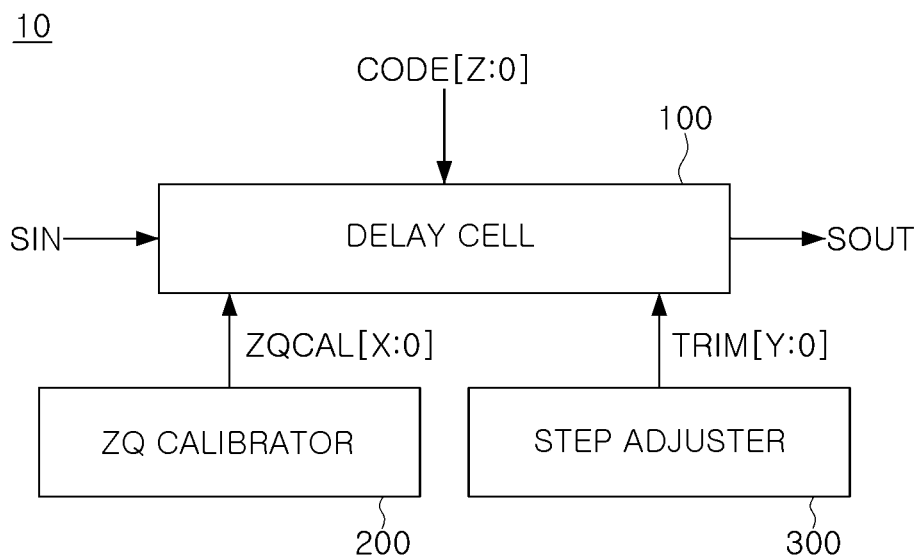
FIG. 1 is a view illustrating a delay control circuit according to an embodiment of the present inventive concept.

FIG. 1 is a view illustrating a delay control circuit according to an embodiment of the present inventive concept.

Referring to FIG. 1, a delay control circuit 10 may include a delay cell 100, a ZQ calibrator 200, and a step adjuster 300.

The delay cell 100 may delay an input signal SIN, externally input, by a delay time. The delay cell 100 may output a signal delayed by the delay time as an output signal SOUT externally.

The delay cell 100 may receive a step code CODE[Z:0] having a predetermined number of bits externally, to change the delay time. The delay cell 100 may increase the delay time, as a bit value of the step code CODE[Z:0] increases.

The delay control circuit 10 may be included in a semiconductor device having an input/output interface. The semiconductor device may perform training for adjusting data input/output timing of the interface, and the delay control circuit 10 may be used for training the interface.

To train the interface accurately, the delay cell 100 should be able to increase the delay time by a constant delay step, as the bit value of the step code CODE[Z:0] increases. A magnitude of the delay step may be independent of an operating frequency of the semiconductor device. For example, when the bit value of the step code CODE[Z:0] increases by '1' regardless of whether the operating frequency of the semiconductor device is 3200 Mbps or 6400 Mbps, the delay cell 100 should be able to increase the delay time by 2.5 ps.

The delay cell 100 may be implemented using inverters and RC circuits. For example, an inverter may have a propagation delay, and an RC circuit, which may be a resistor-capacitor circuit, may have an RC delay determined according to a time constant. The delay cell 100 may have a delay time determined based on the propagation delay and the RC delay.

While a propagation delay of an individual inverter may not be easily reduced below a certain level, a time constant of an individual RC circuit may be more easily reduced to a delay step level. Therefore, the delay cell 100 may generate a reference delay using inverters, and based on the step code CODE[Z:0], the number of activated RC circuits among a plurality of RC circuits having the same time constant may be adjusted to generate an additional delay.

Even when RC circuits included in the delay cell 100 have the same time constant, the delay time may increase non-linearly, as the number of activated RC circuits increases. For example, a portion of the RC delay of the RC circuits may increase, as the number of activated RC circuits increases. Therefore, as the number of activated RC circuits increases, the delay time may gradually increase. Therefore, when the delay cell 100 is not corrected, it may not achieve a constant delay step.

In addition, when process-voltage-temperature (PVT) characteristics of the semiconductor device vary, the fact that the propagation delay and the RC delay are changed may prevent the delay cell 100 from having a constant delay step.

In addition, when the delay control circuit 10 is controlled based on the operating frequency of the semiconductor device, the delay cell 100 may not have a delay step independent of the operating frequency.

According to an embodiment of the present inventive concept, the delay control circuit 10 may use the ZQ calibrator 200, the step adjuster 300, or the like, to control the delay cell 100 to have a delay step independent of the operating frequency and PVT characteristics.

For example, the delay cell 100 may control activation of the RC circuits according to the step code CODE[Z:0], as well as adjust the propagation delay of the inverter, to increase the delay time linearly.

In addition, the delay cell 100 may use a calibration code ZQCAL[X:0] output from the ZQ calibrator 200, to compensate for a PVT characteristic of a semiconductor device included in the delay cell 100. The ZQ calibrator 200 may perform an impedance adjustment such that impedance matching of a transmission line of the semiconductor device is achieved despite a change in the PVT characteristic of the semiconductor device, and the calibration code ZQCAL[X:0] may be a code to be input for the impedance adjustment.

In addition, the step adjuster 300 may compensate for the PVT characteristic of the semiconductor device included in the delay cell 100, and may output a trim code TRIM[Y:0] for controlling the delay cell 100 to have a delay step independent of the operating frequency, to the delay cell 100. For example, the step adjuster 300 may control the delay cell 100 based on the PVT characteristic and the operating frequency of the semiconductor device with reference to a look-up table, such that the delay cell 100 may have a delay step independent of the change in PVT characteristic and the operating frequency.

Hereinafter, a delay cell 100 according to an embodiment of the present inventive concept will be described in detail with reference to FIGS. 2A to 3B.

Figure 2A:
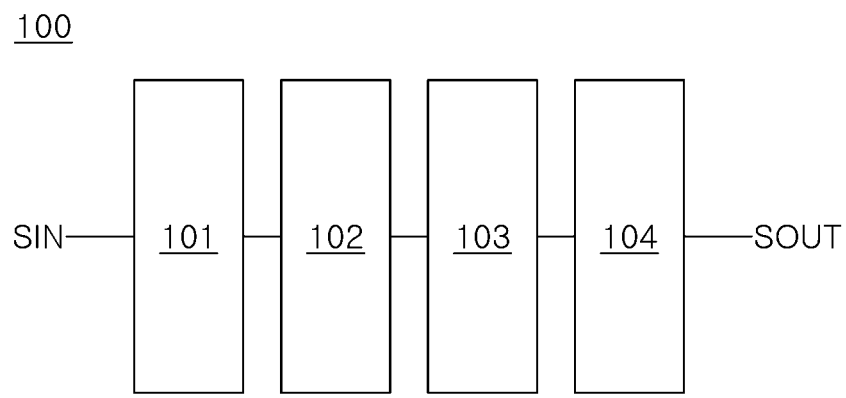
FIGS. 2A and 2B are views illustrating a circuit structure of a delay cell according to an embodiment of the present inventive concept.
Figure 2B:
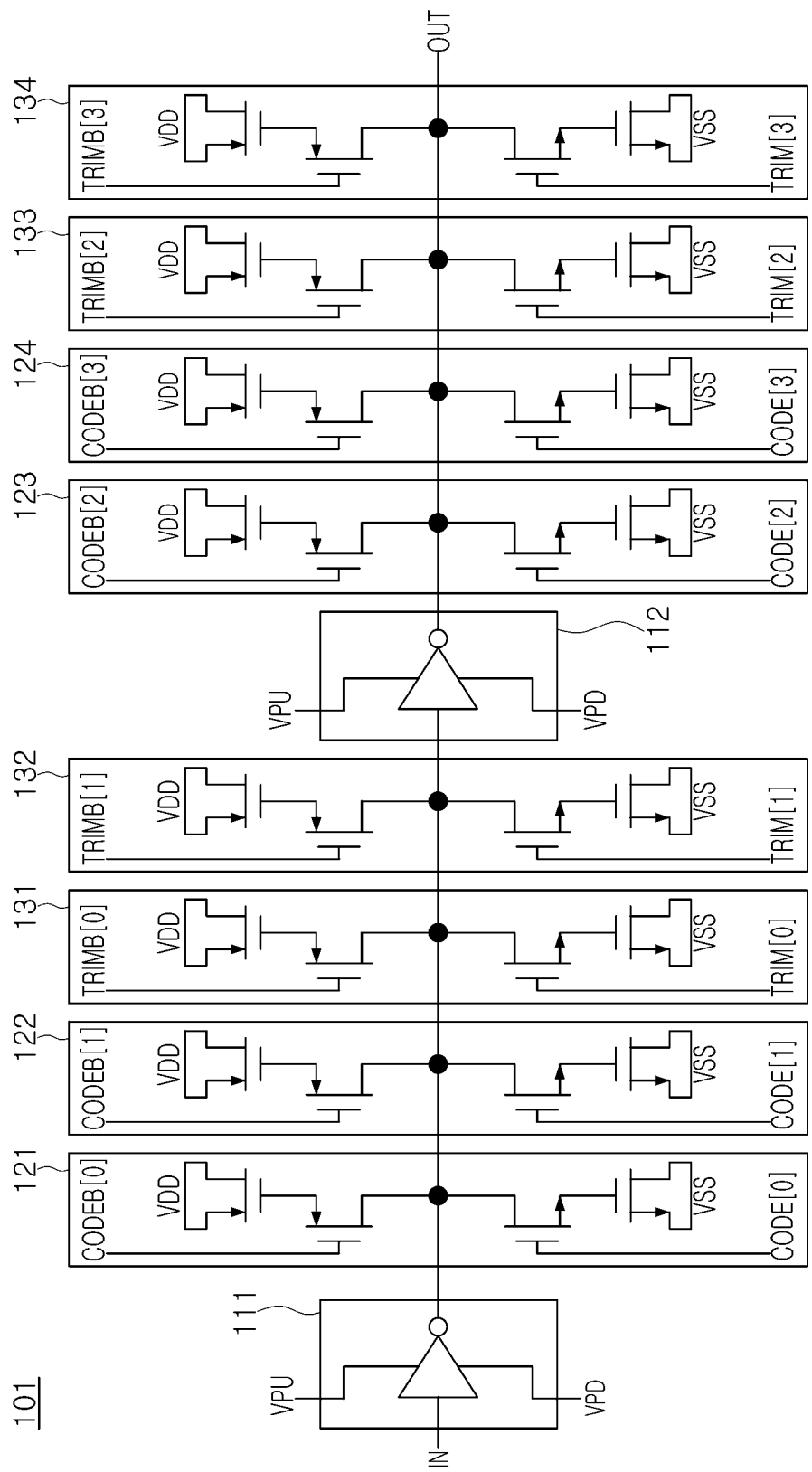

FIGS. 2A and 2B are views illustrating a circuit structure of a delay cell according to an embodiment of the present inventive concept.

Referring to FIG. 2A, a delay cell 100 may include a plurality of sub-delay cells 101, 102, 103 and 104. Each of the sub-delay cells 101 to 104 may have the same circuit structure and may be connected with each other in series. For example, an input signal SIN may be input to an input terminal of a first sub-delay cell 101, a delayed output signal SOUT may be output through an output terminal of a fourth sub-delay cell 104, and remaining input terminals or output terminals of the sub-delay cells 101 to 104 may be connected to an output terminal or an input terminal of an adjacent sub-delay cell.

FIG. 2B is a circuit diagram illustrating a circuit structure of a sub-delay cell 101 in detail.

Referring to FIG. 2B, a sub-delay cell 101 may include a plurality of inverters 111 and 112, a plurality of first RC circuits 121, 122, 123 and 124, and a plurality of second RC circuits 131, 132, 133 and 134.

The plurality of inverters 111 and 112 may be controlled by the calibration code ZQCAL[X:0], as described with reference to FIG. 1. The calibration code ZQCAL[X:0] may be a signal generated by the ZQ calibrator 200 and may include a pull-up code and a pull-down code. A pull-up voltage VPU determined based on the pull-up code, and a pull-down voltage VPD determined based on the pull-down code may be input to the plurality of inverters 111 and 112, to compensate for PVT characteristics of the plurality of inverters 111 and 112. An example of a more detailed circuit structure of the plurality of inverters 111 and 112 will be described later with reference to FIG. 3A.

The plurality of first RC circuits 121 to 124 may be controlled by the step code CODE[Z:0], as described with reference to FIG. 1. The step code CODE[Z:0] may control the number of activated first RC circuits in the delay cell 100. In the example of FIGS. 2A and 2B, one sub-delay cell may include four first RC circuits, and thus, the delay cell 100 including four sub-delay cells may include a total of 16 first RC circuits. In this case, the step code CODE[Z:0] may be composed of 4-bit data. The 4-bit data of the step code CODE[Z:0] may control the number of activated RC circuits among the 16 first RC circuits included in the delay cell 100. For example, the step code CODE[Z:0] may have a value of '0000' to '1111', and 0 to 16 first RC circuits may be activated according to a value of the step code CODE[Z:0].

According to an embodiment of the present inventive concept, the delay cell 100 may further include the plurality of second RC circuits 131 to 134 that may be controlled by the trim code TRIM[Y:0], as described with reference to FIG. 1. Similar to the step code CODE[Z:0], the trim code TRIM[Y:0] may control the number of activated second RC circuits in the delay cell 100. The trim code TRIM[Y:0] may be generated by the step adjuster 300, and may be controlled to compensate for PVT characteristics of the first RC circuits 121 to 124 and PVT characteristics of the second RC circuits 131 to 134, and for the delay cell 100 to have a delay step having a magnitude independent of an operating frequency.

The first RC circuits 121 to 124 and the second RC circuits 131 to 134 may have the same circuit structure, and may have the same time constant. Structures of the first RC circuits 121 to 124 and structures of the second RC circuits 131 to 134 will be described later with reference to FIG. 3B.

Figure 3A:
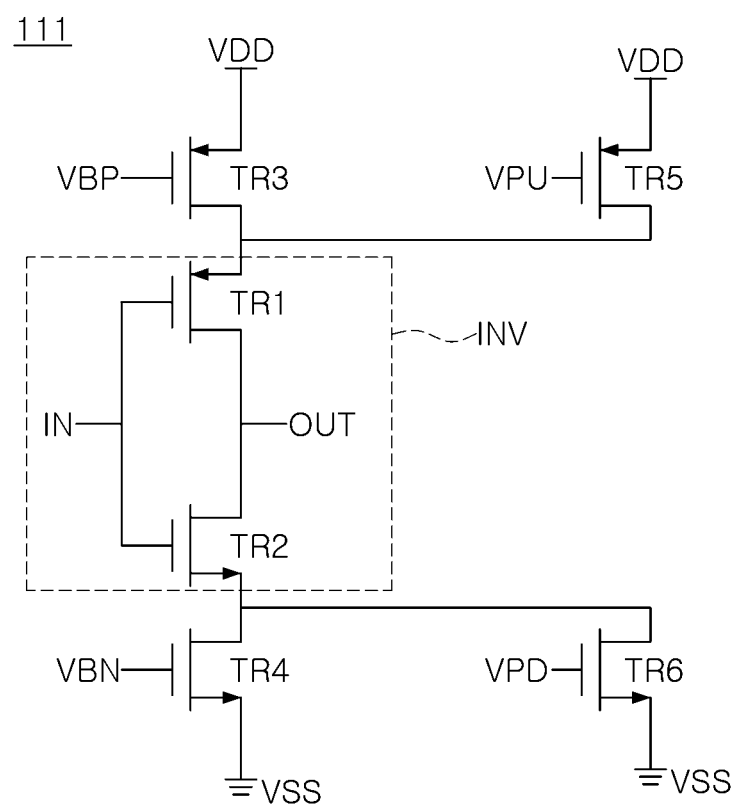
FIG. 3A is a circuit diagram specifically illustrating an inverter according to an embodiment of the present inventive concept.

FIG. 3A is a circuit diagram specifically illustrating an inverter according to an embodiment of the present inventive concept.

Referring to FIG. 3A, a first inverter 111 may include a plurality of transistors TR1, TR2, TR3, TR4, TR5 and TR6. First and second transistors TR1 and TR2 may provide a basic circuit INV of an inverter for inverting a signal IN of an input terminal and outputting the inverted signal OUT to an output terminal. When, in the basic circuit INV, the signal IN of the input terminal is inverted and the inverted signal OUT is output to the output terminal, a propagation delay may occur between the signal IN of the input terminal and the inverted signal OUT of the output terminal.

Third and fourth transistors TR3 and TR4 may control an amount of current flowing into the basic circuit INV to adjust a magnitude of the propagation delay. For example, an amount of current flowing to the basic circuit INV may be controlled according to a magnitude of a positive bias voltage VBP applied to a gate of the third transistor TR3 and a magnitude of a negative bias voltage VBN applied to a gate of the fourth transistor TR4. Like the first inverter 111, an inverter for controlling the amount of current flowing in the basic circuit INV using the positive and negative bias voltages VBP and VBN may be referred to as a biased inverter. In other words, the first inverter 111 may be referred to as a biased inverter.

According to an embodiment of the present inventive concept, the positive and negative bias voltages VBP and VBN applied to the first inverter 111 may be determined according to a step code CODE[Z:0] input to the delay cell 100. For example, the positive and negative bias voltages VBP and VBN may be predetermined such that a delay time generated in the delay cell 100 linearly increases according to the step code CODE[Z:0].

For example, the delay control circuit 10 may increase the magnitude of the positive and negative bias voltages VBP and VBN, as a value of the step code CODE[Z:0] increases. Since an RC delay may increase as the value of the step code CODE[Z:0] increases, the magnitude of the positive and negative bias voltages VBP and VBN may increase to maintain a portion of the RC delay and a portion of the propagation delay, regardless of the value of the step code CODE[Z:0].

According to an embodiment of the present inventive concept, the first inverter 111 may further include fifth and sixth transistors TR5 and TR6 for compensating for PVT characteristics of a device. The fifth transistor TR5 may be connected to the third transistor TR3 in parallel, and the sixth transistor TR6 may be connected to the fourth transistor TR4 in parallel. A pull-up voltage VPU and a pull-down voltage VPD determined based on a pull-up code and a pull-down code, included in the calibration code ZQCAL[X:0], may be respectively input to the fifth transistor TR5 and the sixth transistor TR6. The pull-up code and the pull-down code, determined by the ZQ calibrator 200, may reflect the PVT characteristic of the device, such that the pull-up voltage VPU and the pull-down voltage VPD may compensate for the PVT characteristics of the first inverter 111. A relationship between the pull-up code and the pull-up voltage VPU and a relationship between the pull-down code and the pull-down voltage VPD may be predetermined in advance.

Other inverters included in the delay cell 100 may have the same structure as the first inverter 111, as described with reference to FIG. 3A. For example, the second inverter 112 may have the same structure as the first inverter 111.

Figure 3B:
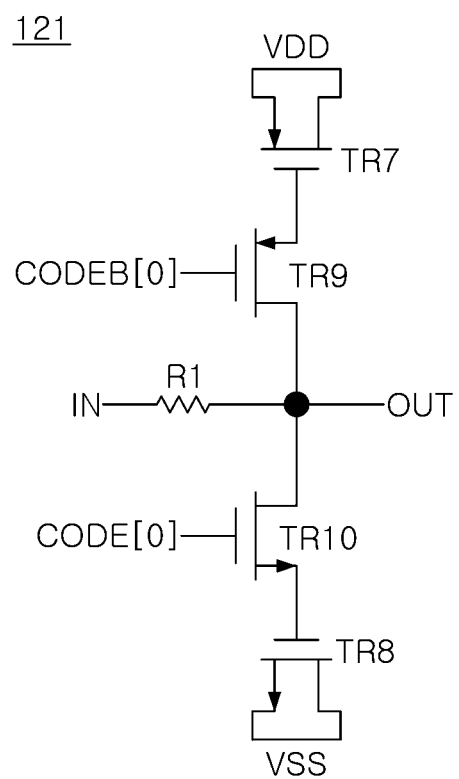
FIG. 3B is a circuit diagram specifically illustrating an RC circuit according to an embodiment of the present inventive concept.

FIG. 3B is a circuit diagram specifically illustrating an RC circuit according to an embodiment of the present inventive concept.

Referring to FIG. 3B, a first RC circuit 121 may include a resistive component R1 and a plurality of transistors TR7, TR8, TR9 and TR10. The first RC circuit 121 of FIG. 3B may correspond to the first RC circuit 121 of FIG. 2B, and the first RC circuit 121 of FIG. 3B illustrates the resistive component R1 from which the first RC circuit 121 of FIG. 2B has omitted.

A first power voltage VDD may be applied to active regions of a seventh transistor TR7, and a second power voltage VSS, lower than the first power voltage VDD, may be applied to active regions of an eighth transistor TR8. For example, the same voltage may be applied to the active regions of the seventh and eighth transistors TR7 and TR8, respectively, and the seventh and eighth transistors TR7 and TR8 may function as metal-oxide-semiconductor (MOS) capacitors. The MOS capacitors and the resistive component R1 may provide an RC delay.

Ninth and tenth transistors TR9 and TR10 may control a connection between the MOS capacitors (e.g., the seventh and eighth transistors TR7 and TR8) and the resistive component R1 to activate or deactivate the first RC circuit 121. For example, a signal CODE[0] based on the step code CODE[Z:0] may be input to a gate of the tenth transistor TR10, and an inverted signal CODEB[0] of the signal CODE[0] may be input to a gate of the ninth transistor TR9. The signal CODE[0] and the inverted signal CODEB[0] may be referred as a pair of activation signals.

A circuit structure of RC circuits included in the delay cell 100 has been described using the first RC circuit 121 as an example, in FIG. 3B. The circuit structure illustrated in FIG. 3B may be applied to first RC circuits and second RC circuits, included in the delay cell 100. For example, the first RC circuit 122 and the second RC circuit 131 may have the same structure as the first RC circuit 121 shown in FIG. 3B.

Hereinafter, the ZQ calibrator 200 and the step adjuster 300 for controlling the delay cell 100 to have a constant step delay will be described in more detail with reference to FIGS. 4 to 7.

Figure 4:
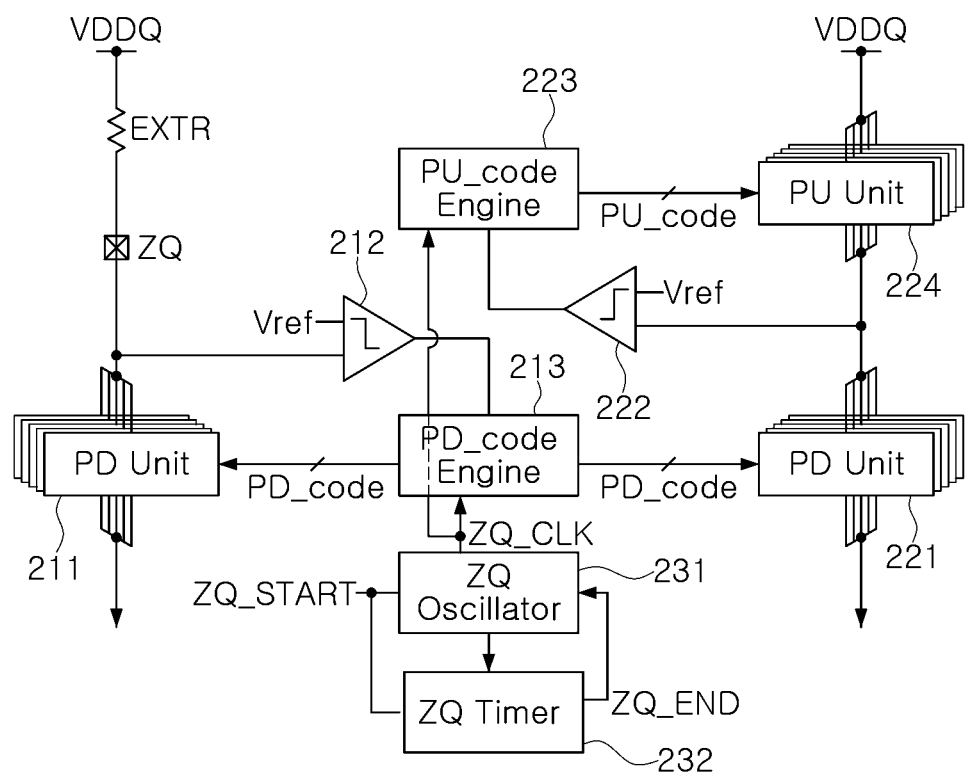
FIG. 4 is a detailed diagram illustrating a ZQ calibrator according to an embodiment of the present inventive concept.

FIG. 4 is a detailed diagram illustrating a ZQ calibrator according to an embodiment of the present disclosure.

Referring to FIG. 4, the ZQ calibrator 200 may include a first pull-down unit 211, a first comparator 212, and a pull-down code engine 213, for generating a pull-down code, the ZQ calibrator 200 may include a second pull-down unit 221, a second comparator 222, a pull-up code engine 223, and a pull-up unit 224, for generating a pull-up code, and the ZQ calibrator 200 may include an oscillator 231 and a timer 232, for controlling an operation of generating the pull-down code and an operation of generating the pull-up code.

The oscillator 231 may generate a clock signal ZQ_CLK provided to the pull-down code engine 213 and the pull-up code engine 223 in response to an external start signal ZQ_START. The timer 232 may operate in response to the clock signal ZQ_CLK, and, when a predetermined time elapses, may generate an end signal ZQ_END to terminate an operation of the oscillator 231.

ZQ calibration may refer to a process of generating an impedance code that changes as a PVT condition of a device changes. A calibration code generated as a result of the ZQ calibration may be used to adjust a termination resistance value. In general, a pad to which an external resistor, which is a reference for calibration, is connected may be referred to as a ZQ pad, and for this reason, the term ZQ calibration may be often used.

In an initial state in which the ZQ calibration is not performed, the first pull-down unit 211, the first comparator 212, and the pull-down code engine 213 may perform a pull-down calibration operation using an external resistor EXTR. For example, the first comparator 212 may receive a first divided voltage generated by the external resistor EXTR and the first pull-down unit 211, connected to the ZQ pad. The first comparator 212 may compare the first divided voltage and a reference voltage Vref, and may generate an up/down signal according to a comparison result thereof. The reference voltage Vref may have a magnitude of VDDQ/3 or VDDQ/2.5, but the present inventive concept is not limited thereto.

The pull-down code engine 213 may generate a pull-down code PD_code of a predetermined bit in response to the up/down signal that is the comparison result of the first comparator 212. A pull-down resistance value of the first pull-down unit 211 may be adjusted by turning on or off a plurality of pull-down units included in the first pull-down unit 211 based on the pull-down code PD_code. For example, the first pull-down unit 211 may include a plurality of pull-down units connected to each other in parallel. An adjusted resistance value of the first pull-down unit 211 may affect the first divided voltage. As a result, the pull-down calibration operation may be repeated until the resistance value of the first pull-down unit 211 becomes equal to a resistance value of the external resistor EXTR.

The pull-down code PD_code generated by the pull-down calibration operation may be input to the second pull-down unit 221. A pull-down resistance value of the second pull-down unit 221 may be determined by the pull-down code PD_code. The second comparator 222, the pull-up code engine 223, and the pull-up unit 224 may perform a pull-up calibration operation based on the pull-down resistance value of the second pull-down unit 221. Similar to the pull-down calibration operation, the second comparator 222 may receive a second divided voltage generated by the second pull-down unit 221 and the pull-up unit 224. The second comparator 222 may compare the second divided voltage and the reference voltage Vref, and may output an up/down signal according to a comparison result thereof.

The pull-up code engine 223 may generate a pull-up code PU_code having a predetermined bit in response to the up/down signal that is the comparison result of the second comparator 222. A pull-up resistance value of the pull-up unit 224 may be adjusted by turning on or off a plurality of pull-up units included in the pull-up unit 224 based on the pull-up code PU_code. A pull-up resistance value may affect the second divided voltage. As a result, the pull-up calibration operation may be repeated until the second divided voltage and the reference voltage Vref have the same magnitude.

When a ZQ calibration operation including the pull-down calibration operation and the pull-up calibration operation is performed, impedance matching of a transmission line of a semiconductor device including the delay control circuit 10 may be performed.

Devices included in the delay control circuit 10 may be manufactured in the same process, and may operate under the same voltage condition and the same temperature condition. Therefore, a PVT characteristic of a device included in the delay cell 100 may be compensated by using the pull-down code PD_code and the pull-up code PU_code, determined by the ZQ calibration operation. According to an embodiment of the present inventive concept, the ZQ calibrator 200 may input the pull-down code PD_code and the pull-up code PU_code to the delay cell 100. The pull-down code PD_code and the pull-up code PU_code may be input to a pull-up circuit and a pull-down circuit, included in each of the inverters included in the delay cell 100. PVT characteristics of inverters may be compensated by the pull-down code PD_code and the pull-up code PU_code.

Figure 5A:
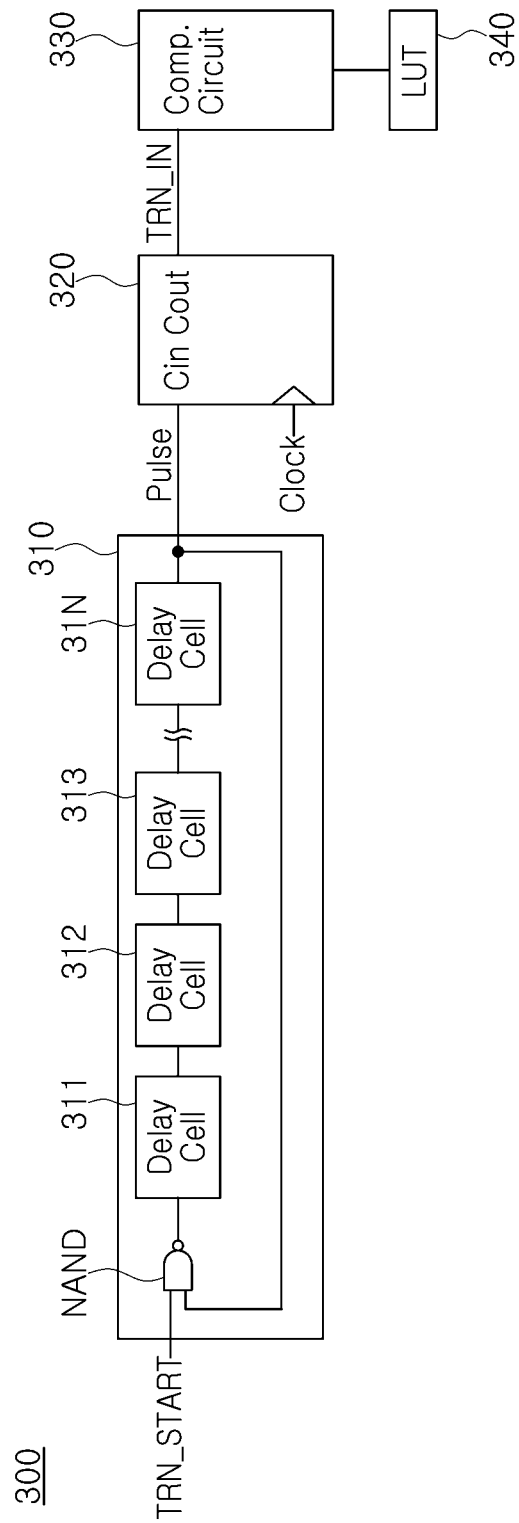
FIGS. 5A and 5B are views illustrating in detail a step adjuster according to an embodiment of the present inventive concept.

FIG. 5A is a view illustrating in detail a first example of a step adjuster according to an embodiment of the present inventive concept.

Referring to FIG. 5A, the step adjuster 300 may include a ring oscillator 310, a pulse counter 320, a comparison circuit 330, and a look-up table circuit 340.

The ring oscillator 310 may include a NAND gate and a plurality of test delay cells 311 to 31N. The test delay cells 311 to 31N may have the same circuit structure as the delay cell 100, as described with reference to FIGS. 2A and 2B. The test delay cells 311 to 31N may be delay cells provided to test the delay cell 100. A region in which the test delay cells 311 to 31N are formed on a substrate of a semiconductor device may be different from a region in which the delay cell 100 is formed. The test delay cells 311 to 31N may be formed in the same process as the delay cell 100, and the test delay cells 311 to 31N and the delay cell 100 may have the same PVT characteristics.

When the ring oscillator 310 includes N test delay cells 311 to 31N (where N is a natural number), a period of a pulse generated by the ring oscillator 310 may correspond to N times of a delay time of one delay cell. For example, while a start signal TRN_START input to the NAND gate of the ring oscillator 310 maintains a logic high state, the NAND gate may output an inverted signal of a signal input from the delay cell 31N. Since the test delay cells 311 to 31N may include an even number of inverters, a signal output from the NAND gate may be input to the test delay cell 311, and may be output in a state not inverted after passing through the N test delay cells 311 to 31N. When the non-inverted signal is input to the NAND gate, the NAND gate may output an inverted signal. Therefore, while the start signal TRN_START of the ring oscillator 310 maintains a logic high state, a pulse having a period corresponding to N times of the delay time may be output. A delay of the NAND gate may be negligibly low.

Depending on an implementation, the number N of the test delay cells 311 to 31N may be determined such that a period of a pulse output from the ring oscillator 310 may be sufficiently larger than an operation period of a clock signal. For example, the ring oscillator 310 may include about 20 to 30 test delay cells, but the present inventive concept is not limited thereto.

The pulse counter 320 may determine a period of a pulse output from the ring oscillator 310 using a clock signal having an operating frequency. For example, the pulse counter 320 may determine a pulse count by counting the number of rising edges or falling edges of the clock signal while the pulse maintains a logic high state. The pulse count may correspond to a period of a pulse.

The comparison circuit 330 may determine PVT characteristics of first and second RC circuits included in the test delay cells 311 to 31N based on the pulse count determined by the pulse counter 320. In addition, the comparison circuit 330 may use the look-up table circuit 340 to determine a value of a trim code (e.g., TRIM[Y:0]) such that the delay cell 100 having the same characteristic as the PVT characteristic may have a constant delay step, regardless of an operating frequency of the delay control circuit 10. The trim code (e.g., TRIM[Y:0]) may be input to second RC circuits (e.g., 131-134) of the delay cell 100, to activate at least a portion of RC circuits among the second RC circuits (e.g., 131-134).

The look-up table circuit 340 may store information on the pulse count of the ring oscillator 310 for each PVT characteristic and for each operating frequency of the delay control circuit 10, when the delay cell 100 has a constant delay step.

In order for the comparison circuit 330 to determine the PVT characteristics of the first and second RC circuits (e.g., 121-124 and 131-134), it is possible to obtain two or more pulse counts for more than one case in which the number of activated RC circuits among the second RC circuits (e.g., 131-134) included in the test delay cells 311 to 31N are different from each other. Depending on an implementation, the step adjuster 300 may include two or more ring oscillators and two or more counters that may operate in parallel with each other, to quickly obtain the two or more pulse counts.

Figure 5B:
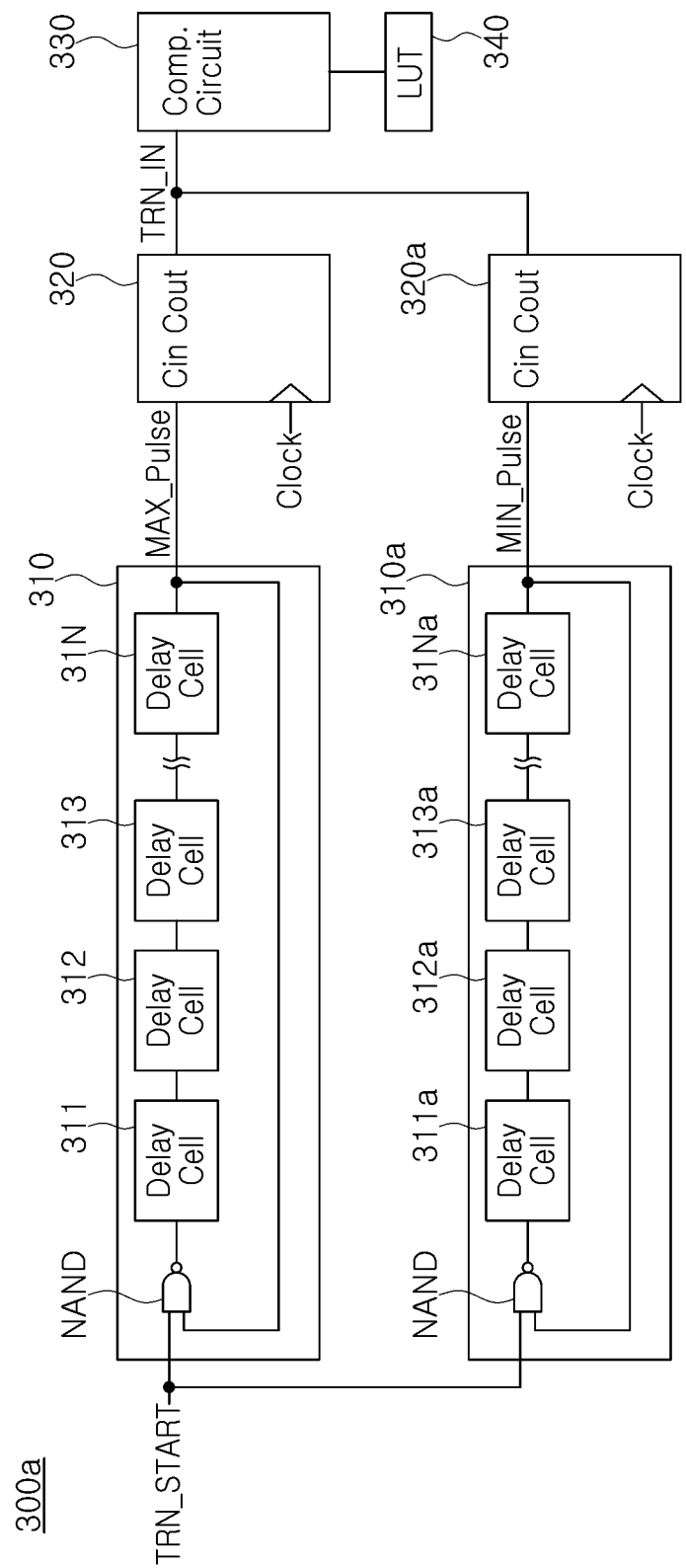

FIG. 5B is a view illustrating in detail a second example of a step adjuster according to an embodiment of the present inventive concept.

Referring to FIG. 5B, a step adjuster 300a may include a plurality of ring oscillators (e.g., 310 and 310a), a plurality of counters (e.g., 320 and 320a), a comparison circuit 330, and a look-up table circuit 340. A first ring oscillator 310, a first counter 320, the comparison circuit 330, and the look-up table circuit 340, illustrated in FIG. 5B, may correspond to the ring oscillator 310, the counter 320, the comparison circuit 330, and the look-up table circuit 340, illustrated in FIG. 5A.

The step adjuster 300a may include a second ring oscillator 310a having the same circuit structure as the first ring oscillator 310, and a second counter 320a having the same circuit structure as the first counter 320.

The delay control circuit 10 may activate all second RC circuits (e.g., 131-134) included in the first ring oscillator 310, and may deactivate all second RC circuits (e.g., 131-134) included in the second ring oscillator 310a. A delay time of a test delay cell 100 may vary depending on whether second RC circuits (e.g., 131-134) of the test delay cell 100 are activated. As a result, a period of a pulse output from the first ring oscillator 310 may be different from a period of a pulse output from the second ring oscillator 310a.

In FIG. 5B, a pulse output from the first ring oscillator 310 is illustrated as a maximum pulse MAX_Pulse, and a pulse output from the second ring oscillator 310a is illustrated as a minimum pulse (MIN_Pulse).

The first counter 320 may determine a maximum pulse period, which may be a period of the maximum pulse MAX_Pulse using a clock signal, and the second counter 320a may determine a minimum pulse period, which may be a period of the minimum pulse MIN_Pulse using the clock signal.

The maximum pulse period from the first counter 320 and the minimum pulse period from the second counter 320a may be input to the comparison circuit 330 as a training input signal TRN_IN, to determine a PVT characteristic of a second RC circuit (e.g., one of 131-134).

Hereinafter, an operation of the step adjuster 300a described with reference to FIG. 5B will be described in detail with reference to FIG. 6.

Figure 6:
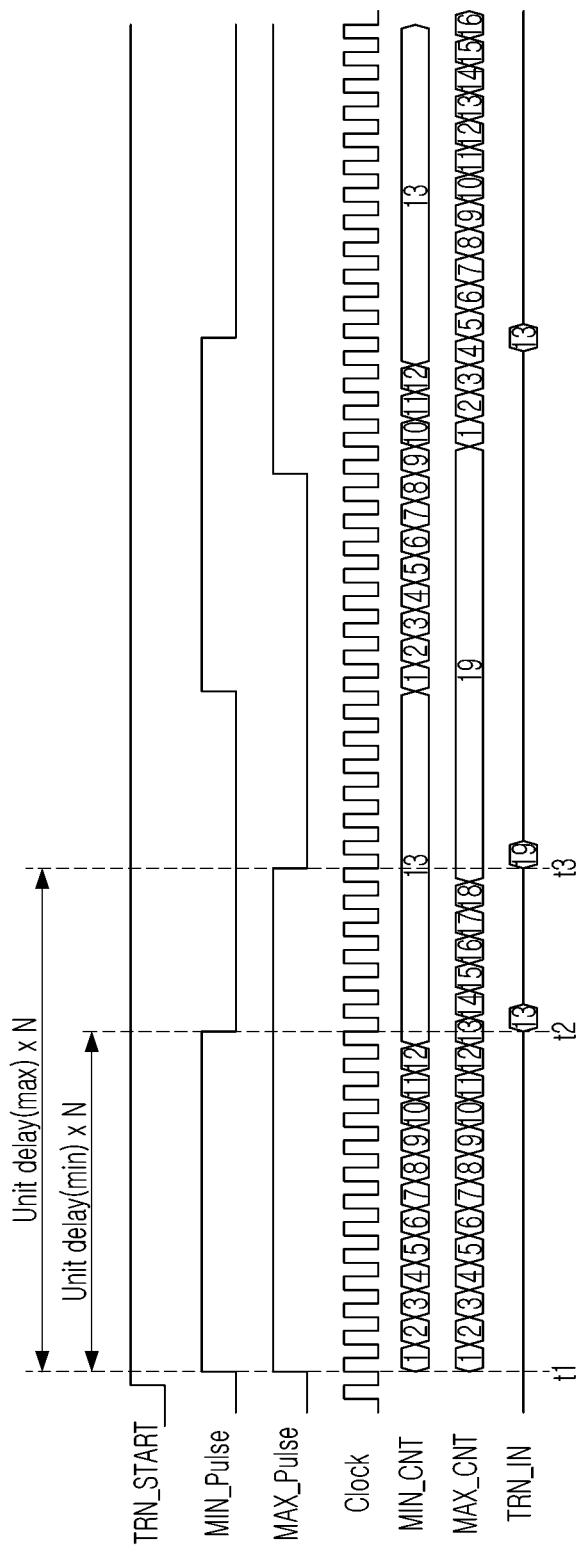
FIG. 6 is a timing diagram illustrating an operation timing of a step adjuster according to an embodiment of the present inventive concept.

FIG. 6 is a timing diagram illustrating an operation timing of a step adjuster according to an embodiment of the present inventive concept.

FIG. 6 illustrates timings of a start signal TRN_START, a clock signal Clock, a pulse period (e.g., MIN_Pulse and MAX_Pulse), a pulse count signal (e.g., MIN_CNT and MAX_CNT) corresponding to the pulse period, and a training input signal TRN_IN.

When the start signal TRN_START is changed to have a logic high state, ring oscillators (e.g., 310 and 310a) may oscillate and output a pulse. FIG. 6 illustrates a case in which the first and second ring oscillators 310 and 310a output pulses from a first time point t1.

FIG. 6 illustrates timings of a maximum pulse MAX_Pulse output from the first ring oscillator 310 and a minimum pulse MIN_Pulse output from the second ring oscillator 310a. A maximum pulse period may correspond to N times of a delay time when all second RC circuits (e.g., 131-134) of one delay cell 100 are activated, and the minimum pulse period may correspond to N times of a delay time when all second RC circuits (e.g., 131-134) of one delay cell 100 are deactivated.

A plurality of counters (e.g., 320 and 320a) may determine a maximum pulse count MAX_CNT and a minimum pulse count MIN_CNT using the clock signal Clock having an operating frequency. For example, the second counter 320a may count the number of occurrences of a rising edge of the clock signal Clock as the minimum pulse count MIN_CNT, while the minimum pulse MIN_Pulse maintains a logic high state. The minimum pulse MIN_Pulse may maintain a logic high state from the first time point t1 to a second time point t2, and the minimum pulse count MIN_CNT may be determined as '13.'

Similarly, the first counter 320 may count the number of occurrences of a rising edge of the clock signal Clock as the maximum pulse count MAX_CNT, while the maximum pulse MAX_Pulse maintains a logic high state. The maximum pulse MAX_Pulse may maintain a logic high state from the first time point t1 to a third time point t3, and the maximum pulse count MAX_CNT may be determined as '19.'

Depending on an implementation, the first and second counters 320 and 320a may count the maximum pulse count MAX_CNT and the minimum pulse count MIN_CNT, when the maximum pulse MAX_Pulse and the minimum pulse MIN_Pulse are in a logic low state.

The comparison circuit 330 may determine PVT characteristics of first and second RC circuits (e.g., 121-124 and 131-134) using the maximum pulse count MAX_CNT and the minimum pulse count MIN_CNT. For example, the PVT characteristics of the first and second RC circuits (e.g., 121-124 and 131-134) may be determined as any one of 'fast (FAST),' 'typical (TYP),' and 'slow (SLOW).'

A fact in which a PVT characteristic of a device is fast may indicate that the device is sensitive to external conditions. For example, the faster the PVT characteristics of the second RC circuits (e.g., 131-134), the greater the period of the pulse, as the number of activated second RC circuits (e.g., 131-134) increases. When the PVT characteristics of the second RC circuits (e.g., 131-134) are fast, the PVT characteristics of the first RC circuits (e.g., 121-124) may also be fast.

Therefore, a value of the maximum pulse count MAX_CNT and a value of the minimum pulse count MIN_CNT may increase, as the PVT characteristics of the second RC circuits (e.g., 131-134) are fast, and a difference between the value of the maximum pulse count MAX_CNT and the value of the minimum pulse count MIN_CNT may also be widened.

The present inventive concept is not limited to determining PVT characteristics of RC circuits as any one of 'fast (FAST),' 'typical (TYP),' and 'slow (SLOW),' and the PVT characteristics may be further subdivided or may be determined as a continuous value.

Information indicating a relationship between a pulse count and a device characteristic may be previously stored in the step adjuster 300. The comparison circuit 330 may compare the value of the maximum pulse count MAX_CNT and the value of the minimum pulse count MIN_CNT, obtained from the counter (e.g., 320 and 320a), with the information, to determine PVT characteristics of second RC circuits (e.g., 131-134). The information may be stored in the form of a look-up table circuit, but the present inventive concept is not limited thereto.

When the PVT characteristics of the first and second RC circuits (e.g., 121-124 and 131-134) are determined, the comparison circuit 330 may determine the number of second RC circuits (e.g., 131-134) to be activated in the delay cell 100 with reference to the look-up table circuit 340.

FIG. 7 is a view illustrating a look-up table according to an embodiment of the present inventive concept.

Referring to FIG. 7, the look-up table circuit 340 may store information of a reference pulse count according to an operating frequency and a PVT characteristic of an RC circuit. The reference pulse count may refer to a count of pulses that may be output from the ring oscillator (e.g., 310), when a delay time at which first RC circuits (e.g., 121-124) of a delay cell (e.g., 100) are all activated and a delay time at which the first RC circuits (e.g., 121-124) are all deactivated are adjusted to have a determined difference. The determined difference may be determined based on a necessary delay step and the number of first RC circuits (e.g., 121-124) included in the delay cell 100. For example, when the delay cell 100 includes 16 first RC circuits and the necessary delay step is 2.5 ps, the determined difference may be 40 ps (=16*2.5 ps). The reference pulse count may be determined experimentally.

The comparison circuit 330 may determine the reference pulse count based on the operating frequency and the PVT characteristic of the RC circuit using the look-up table circuit 340. The comparison circuit 330 may adjust the number of activated RC circuits, among second RC circuits (e.g., 131-134) included in the ring oscillator 310, and may count a period of a pulse output from the ring oscillator 310. The comparison circuit 330 may generate the trim code TRIM[Y:0] based on the number of activated second RC circuits (e.g., 131-134) when the count of pulses output from the ring oscillator 310 matches the reference pulse count. The trim code (TRIM[Y:0]) may be input to the delay cell 100 to control the number of second RC circuits (e.g., 131-134) activated in the delay cell 100, and a magnitude of a delay step according to a step code (CODE[Z:0]) in the delay cell 100 may be determined independently of the operating frequency and the PVT characteristics of the RC circuit.

Figure 8A:
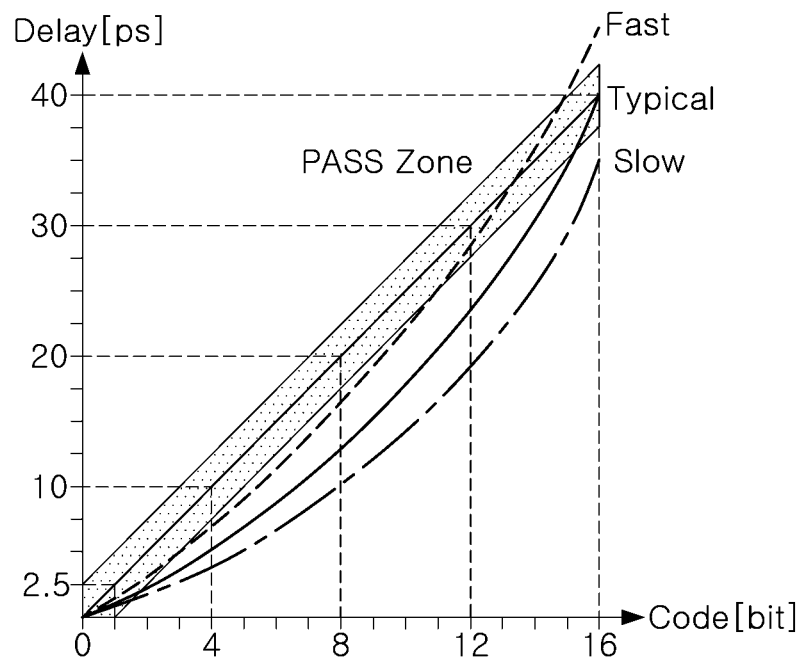
FIGS. 8A, 8B and 8C are views illustrating a delay adjustment effect of a delay adjustment circuit according to an embodiment of the present inventive concept.
Figure 8B:
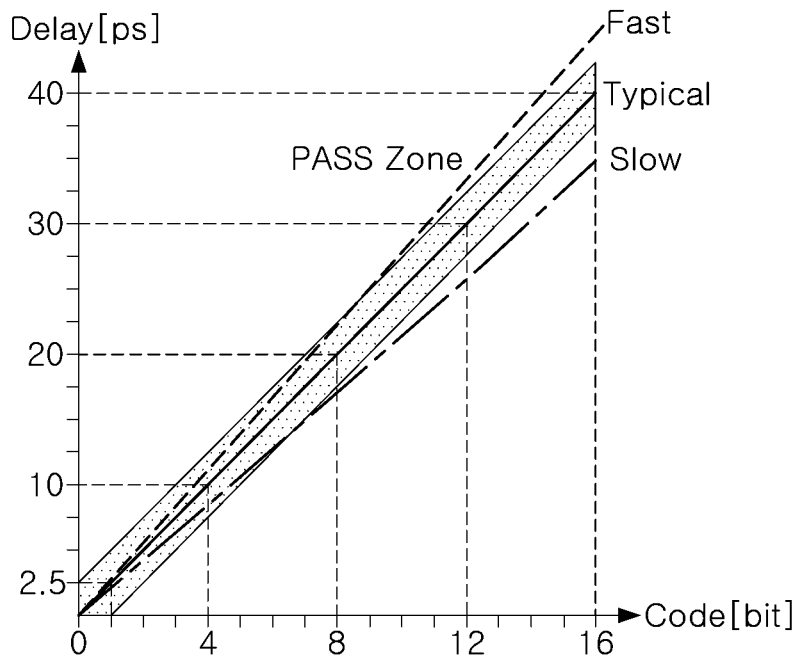
Figure 8C:
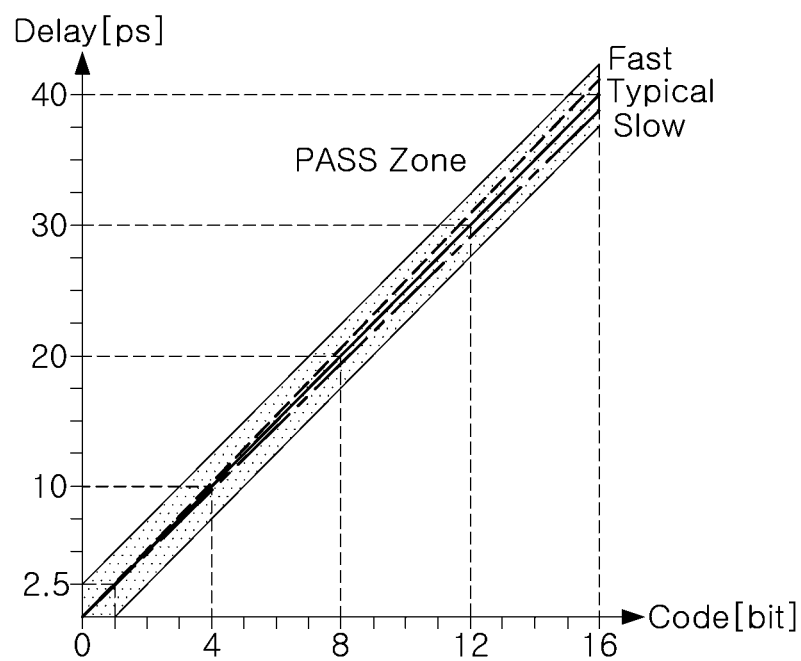

FIGS. 8A to 8C are views illustrating a delay adjustment effect of a delay adjustment circuit according to an embodiment of the present inventive concept.

FIG. 8A is a graph illustrating a delay according to a PVT characteristic of a device in a state in which a delay of the delay cell 100 is not adjusted.

In a graph of FIG. 8A, a horizontal axis indicates a value of a step code, and a vertical axis indicates a delay time according to the step code. For example, a delay time is illustrated to increase as the value of the step code increases, based on a delay time at which the value of the step code is '0.' As the value of the step code increases, the number of activated first RC circuits (e.g., 121-124) may increase.

Even when first RC circuits (e.g., 121-124) included in the delay cell 100 have the same time constant, a delay time may increase non-linearly, as the value of the step code increases. Referring to FIG. 8A, as the number of activated first RC circuits (e.g., 121-124) increases, a delay time may gradually increase.

The graph of FIG. 8A illustrates delay times for which each of the characteristics is fast, typical, and slow. As the device characteristic is faster, the delay time may rapidly increase, as the number of the first RC circuits (e.g., 121-124) increases.

For interface training of a semiconductor device, a delay time is necessary to increase linearly, as the step code increases. FIG. 8A illustrates a range of a delay time necessary according to a value of a step code, as a pass zone.

When linearity of the delay of the delay cell 100 is not corrected, the delay time may increase non-linearly according to the value of the step code, such that the delay time is out of the pass zone at most values of the step code.

FIG. 8B is a graph illustrating a delay according to a PVT characteristic of a device in a state in which linearity of a delay of the delay cell 100 is corrected.

In a graph of FIG. 8B, a horizontal axis indicates a value of a step code, and a vertical axis indicates a delay time according to the step code. Referring to FIG. 8B, as the value of the step code increases, a delay time may increase linearly.

According to an embodiment of the present inventive concept, inverters included in the delay cell 100 may be bias inverters, and the delay control circuit 10 may apply bias voltages determined according to a step code to the bias inverters, to correct the linearity of the delay time.

For example, the delay control circuit 10 may increase the bias voltages applied to the bias inverters, as the value of the step code increases. As the value of the step code increases, an RC delay may increase, and a propagation delay of the inverter may further increase by increasing the bias voltages, to keep a proportion of the RC delay and a proportion of the propagation delay constant, regardless of the value of the step code.

The graph of FIG. 8B illustrates delay times for which each of the characteristics is fast, typical, and slow. Referring to FIG. 8B, when the device characteristic is typical, delay times for all values of the step code may belong to a pass zone. When the device characteristic is fast or slow, as the value of the step code increases, the delay time may deviate from the pass zone. For example, there may be cases in which a necessary delay step may not be obtained only by correcting the linearity of the delay time.

FIG. 8C is a graph illustrating a delay according to a PVT characteristic of a device in a state in which linearity of a delay time of the delay cell 100 is corrected and a device characteristic is compensated.

In a graph of FIG. 8C, a horizontal axis indicates a value of a step code, and a vertical axis indicates a delay time according to the step code. Referring to FIG. 8C, when the characteristics is fast, typical, and slow, a delay time according to the value of the step code may belong to a pass zone.

According to an embodiment of the present inventive concept, the delay control circuit 10 may compensate a device characteristic of an inverter included in the delay cell 100 by using a calibration code generated by the ZQ calibrator 200. In addition, the delay control circuit 10 may determine the number of activated RC circuits, among second RC circuits (e.g., 131-134) included in the delay cell 100, based on a device characteristic and an operating frequency. Therefore, the delay control circuit 10 may allow the delay cell 100 to have a predetermined delay step, regardless of a device characteristic and an operating frequency.

Figure 9:
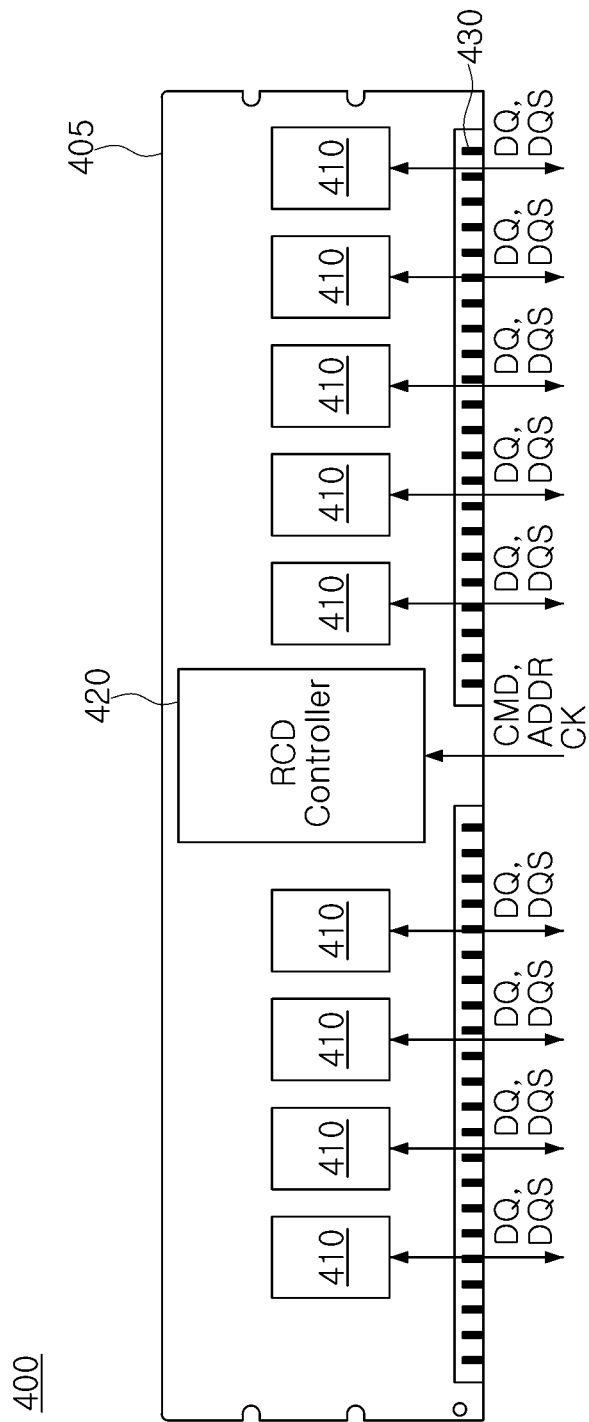
FIG. 9 is a view illustrating a memory module according to an embodiment of the present inventive concept.

FIG. 9 is a view illustrating a memory module according to an embodiment of the present inventive concept.

Referring to FIG. 9, a memory module 400 may include a plurality of memory devices 410, a registered clock driver (RCD) controller 420, and signal pins 430. The memory devices 410, the RCD controller 420, and the signal pins 430 may be mounted on a module substrate 405.

Each of the memory devices 410 may exchange a data signal DQ and a data strobe signal DQS with an external device, for example, a host through the signal pins 430.

The RCD controller 420 may transmit a command CMD, an address ADDR, and a clock signal CK, received and buffered from an external device, to each of the memory devices 410. The RCD controller 420 may include an input/output interface for receiving a signal from an external device.

The RCD controller 420 may provide the command CMD and the address ADDR to each of the memory devices 410 through a plurality of command/address pins included in each of the memory devices 410. For each of the plurality of command/address pins, lengths of signal paths through which command/address signals CMD/ADDR are transmitted may be different. Nevertheless, the memory devices 410 may be trained such that the command/address signals are input to the plurality of command/address pins at almost the same time.

According to an embodiment of the present inventive concept, the RCD controller 420 may include a delay cell for delaying each of the command/address signals CMD/ADDR received from the host by a determined delay time, and outputting the same to the plurality of command/address pins. The delay cell may delay an input signal by a delay time determined according to a value of a step code, which is input. Timing at which the command/address signals CMD/ADDR are output to the plurality of command/address pins may be adjusted according to the value of the step code.

To train the memory device 410 accurately, the delay cell may be corrected such that the delay time increases by a necessary delay step as the value of the step code increases.

According to an embodiment of the present inventive concept, the RCD controller 420 may adjust the delay cell such that the delay time increases by a constant delay step according to the value of the step code using a look-up table and a ZQ calibration code. The delay step may have a constant value regardless of an operating frequency of the RCD controller 420, for example, a frequency of the clock signal CK. Therefore, the RCD controller 420 may accurately train the memory device 410, and allow the memory device 410 to accurately receive the command/address signal CMD/ADDR output to the memory device 410, to increase reliability of an operation of the memory device 410.

When the command CMD and the address ADDR are received from the host while the RCD controller 420 adjusts the delay cell, the command CMD and the address ADDR may not be processed, to delay a response speed of the host to the command CMD.

The RCD controller 420 may train the input/output interface for receiving a command CMD, an address ADDR, and a clock signal CK from the host. According to an embodiment of the present inventive concept, the RCD controller 420 may adjust the delay cell while training the input/output interface in response to control of the host. Since the host may not provide the command CMD and the address ADDR while the input/output interface may be being trained by the host, it is possible to prevent a delay in response to the command CMD from the host.

A delay control circuit according to an embodiment of the present inventive concept may compensate for a PVT characteristic of a delay cell, based on a ZQ calibration code value, to control the delay cell to delay an input signal in a constant step.

A delay control circuit according to an embodiment of the present inventive concept may determine a PVT characteristic of a delay cell using a ring oscillator including a plurality of delay cells, may compensate for the PVT characteristic of the delay cell using a look-up table, and may control the delay cell to delay an input signal in a constant step regardless of an operating frequency.

A memory module according to an embodiment of the present inventive concept may include a memory controller including a delay control circuit for delaying an input signal in a constant step regardless of an operating frequency of the memory device. The RCD controller may train the memory device using a delay control circuit such that signals are simultaneously input to command/address pins of the memory device.

While embodiments of the present inventive concept have been illustrated and described above, it will be apparent to those skilled in the art that modifications and variations could be made thereto without departing from the scope of the present inventive concept as set forth by the appended claims.

What is claimed is:

1. A delay control circuit, comprising:
a delay cell including a plurality of bias inverters, a plurality of first RC circuits, and a plurality of second RC circuits, wherein the delay cell activates a number of first RC circuits in response to a value of a step code, delays a signal that was externally input, by a delay time based on the number of the activated first RC circuits, and outputs the delayed signal;
a ZQ calibrator including a plurality of pull-up circuits and a plurality of pull-down circuits, wherein the ZQ calibrator adjusts a number of activated pull-up circuits and a number of activated pull-down circuits, to adjust an impedance of a transmission line, and inputs a pull-up voltage and a pull-down voltage, based on a calibration code corresponding to the number of the activated pull-up circuits and the number of the activated pull-down circuits, to the plurality of bias inverters; and
a step adjuster including a first ring oscillator including a plurality of test delay cells having a circuit structure, equal to a circuit structure of the delay cell, wherein the step adjuster determines characteristics of the first and second RC circuits, based on a pulse period that depends on whether or not the second RC circuits included in the first ring oscillator are activated, and activates a number of second RC circuits based on the characteristics and an operating frequency of the delay control circuit.

2. The delay control circuit of claim 1, wherein the delay control circuit further applies bias voltages based on the value of the step code to the plurality of bias inverters.

3. The delay control circuit of claim 2, wherein the bias voltages are predetermined to have a value that causes the delay time to increase linearly as the value of the step code input to the delay cell increases.

4. The delay control circuit of claim 2, wherein the bias voltages have a larger value as the value of the step code input to the delay cell increases.

5. The delay control circuit of claim 2, wherein each of the plurality of bias inverters comprises:
a first transistor and a second transistor, forming a basic circuit that inverts a signal of an input terminal and outputs the inverted signal to an output terminal,
a third transistor in which a first power voltage is applied to its source, a drain of the third transistor is connected to the first transistor, a first bias voltage among the bias voltages is applied to a gate of the third transistor, and
a fourth transistor in which a second power voltage, lower than the first power voltage, is applied to its source, a drain of the fourth transistor is connected to the second transistor, and a second bias voltage among the bias voltage is applied to a gate of the fourth transistor.

6. The delay control circuit of claim 5, wherein each of the plurality of bias circuits comprises:
a fifth transistor in which the first power voltage is applied to its source, a drain of the fifth transistor is connected to the first transistor, and to which the pull-up voltage is applied to a gate of the fifth transistor, and
a sixth transistor in which the second power voltage is applied to its source, a drain of the sixth transistor is connected to the second transistor, and to which the pull-down voltage is applied to a gate of the sixth transistor.

7. The delay control circuit of claim 5, wherein each of the plurality of bias circuits adjusts an amount of current flowing into the basic circuit in response to the bias voltages, to control the delay time of the delay cell to linearly increase.

8. The delay control circuit of claim 1, wherein each of the plurality of first and second RC circuits comprises:
a resistor between an input terminal and an output terminal,
a seventh transistor to which a first power voltage is applied to its active regions,
an eighth transistor to which a second power voltage, lower than the first power voltage, is applied to its active regions,
a ninth transistor having a source connected to a gate of the seventh transistor, and a drain connected to the output terminal, and
a tenth transistor having a source connected to a gate of the eighth transistor, and a drain connected to the output terminal,
wherein a pair of activation signals based on the step code are input to gates of the ninth and tenth transistors.

9. The delay control circuit of claim 1, wherein a time constant of each of the first RC circuits is equal to a time constant of each of the second RC circuits.

10. The delay control circuit of claim 1, wherein the step code is a Z-bit code (where Z is a natural number),
the number of first RC circuits included in the delay cell is $2^Z$, and
the delay control circuit converts the step code to $2^Z$ signals for controlling the first RC circuits, and provides each of the converted signals to each of the first RC circuits.

11. The delay control circuit of claim 1, wherein the step adjuster activates the number of second RC circuits, to control the delay time to increase by a constant delay step according to the step code, and
the delay step is independent of the operating frequency of the delay control circuit.

12. The delay control circuit of claim 1, wherein the step adjuster further comprises:
a counter for determining a maximum pulse count corresponding to a pulse period in a state in which all of the second RC circuits included in the first ring oscillator are activated, and a minimum pulse count corresponding to a pulse period in a state in which all of the second RC circuits in the first ring oscillator are deactivated,
a comparison circuit determining characteristics of the second RC circuits in the first ring oscillator based on the maximum pulse count and the minimum pulse count, and
a look-up table for storing a reference pulse period for each characteristic and each operating frequency, the reference pulse period causes a first delay time in which the value of the step code is a minimum value and a second delay time in which the value of the step code is a maximum value to have a predetermined difference,
wherein the comparison circuit determines the reference pulse period with reference to the look-up table, activates the number of second RC circuits of the first ring oscillator, such that the first ring oscillator has the reference pulse period, to determine a trim code, and inputs the trim code to the number of second RC circuits of the delay cell, to activate the number of second RC circuits of the delay cell.

13. The delay control circuit of claim 12, wherein the counter counts a rising edge or a falling edge of a clock signal input to the counter while a pulse output from the first ring oscillator maintains a logic high state, to determine the pulse periods.

14. The delay control circuit of claim 13, wherein the clock signal has a frequency, equal to the operating frequency.

15. The delay control circuit of claim 1, wherein the step adjuster further comprises:
   a second ring oscillator having a circuit structure, equal to a circuit structure of the first ring oscillator,
   a first counter for determining a maximum pulse period that is a pulse period in a state in which all second RC circuits included in the first ring oscillator are deactivated, and
   a second counter for determining a minimum pulse period that is a pulse period in a state in which all second RC circuits included in the second ring oscillator are deactivated.

16. The delay control circuit of claim 15, wherein the first ring oscillator and the second ring oscillator operate in parallel, and
   the first counter and the second counter operate in parallel.

17. A delay control circuit, comprising:
   a delay cell including a plurality of bias inverters, a plurality of first RC circuits, and a plurality of second RC circuits, wherein the delay cell activates a number of first RC circuits based on a value of an externally input step code, delays an externally input signal by a delay time based on the number of the activated first RC circuits, and outputs the delayed signal;
   a ZQ calibrator for adjusting a value of a ZQ calibration code to adjust an impedance of a transmission line, and for inputting a pull-up voltage and a pull-down voltage, based on the ZQ calibration code, to the plurality of bias inverters; and
   a step adjuster for determining characteristics of the second RC circuits based on a delay time depending on whether or not the second RC circuits are activated, and determining a number of second RC circuits to be activated, according to the characteristics and an operating frequency of the delay control circuit, to control a delay time of the delay cell to increase in a constant step independent of the operating frequency.

18. A memory module, comprising:
   a memory device including a plurality of command/address pins; and
   a memory controller for inputting signals to the command/address pins,
   wherein the memory controller comprises a delay cell for delaying an input signal by a delay time based on a value of a step code, uses a look-up table and a ZQ calibration code to adjust the delay cell such that the delay time is increased by a constant step according to the value of the step code, and uses the adjusted delay cell to adjust a timing at which each signal is output therefrom such that the signals are simultaneously input to the command/address pins,
   wherein the look-up table stores information of a reference pulse count according to an operating frequency and a process-voltage-temperature (PVT) characteristic of an RC circuit.

19. The memory module of claim 18, wherein the constant step is independent of an operating frequency of the memory controller.

20. The memory module of claim 18, wherein the memory controller comprises an input/output interface for receiving a signal from a host, and adjusts the delay cell while training the input/output interface under control of the host.

* * * * *